United States Patent
Awalt et al.

(10) Patent No.: US 7,245,148 B2
(45) Date of Patent: Jul. 17, 2007

(54) POWER SAVING METHOD IN AN INTEGRATED CIRCUIT PROGRAMMING AND CONTROL CIRCUIT

(75) Inventors: Thruston Awalt, Los Gatos, CA (US); Peter Chambers, Phoenix, AZ (US)

(73) Assignee: Micrel, Inc., San Jose, CA (US)

( * ) Notice: Subject to any disclaimer, the term of this patent is extended or adjusted under 35 U.S.C. 154(b) by 92 days.

(21) Appl. No.: 11/237,287

(22) Filed: Sep. 27, 2005

(65) Prior Publication Data

US 2007/0126473 A1    Jun. 7, 2007

(51) Int. Cl.
*G06F 7/38* (2006.01)

(52) U.S. Cl. .............................. 326/38; 326/37; 326/41

(58) Field of Classification Search ............ 326/37–38, 326/41; 341/144, 139
See application file for complete search history.

(56) References Cited

U.S. PATENT DOCUMENTS 5,124,704 A * 6/1992 Kase et al. ................. 341/120
5,541,600 A * 7/1996 Blumenkrantz et al. .... 341/139

* cited by examiner

*Primary Examiner*—Anh Q. Tran
(74) *Attorney, Agent, or Firm*—Patent Law Group LLP; Carmen C. Cook

(57) ABSTRACT

A circuit in an integrated circuit having an input terminal to be coupled to a resistor network for selecting one of multiple digital states in the integrated circuit includes a voltage decode circuit, a control circuit and a power-up control circuit. The first input terminal receives an input voltage having a voltage value associated with the multiple digital states. The voltage decode circuit receives the input voltage and generates a voltage decode signal indicative of the voltage value of the input voltage. The control circuit receives the voltage decode signal and generates an output control signal accordingly where the output control signal selects one of the multiple digital states. The power-up control circuit provides power to the resistor network, the voltage decode circuit and the control circuit for determining the selected digital state and disconnects power to those circuits after the selected digital state is determined.

6 Claims, 4 Drawing Sheets

POWER SAVING METHOD IN AN INTEGRATED CIRCUIT PROGRAMMING AND CONTROL CIRCUIT

CROSS-REFERENCE TO RELATED APPLICATION

This application is related to U.S. patent application Ser. No. 11/237,166, entitled "Analog Control of a Digital Decision Process," filed concurrently, by Ray Zinn et al., now U.S. Pat. No. 7,126,513, issued on Oct. 24, 2006, U.S. patent application Ser. No. 11/237,214, entitled "Programming and Control of An Integrated Circuit Using An Externally Connected Resistor Network," filed concurrently, by Paul Wilson et al., now U.S. Pat. No. 7,102,394, issued on Sep. 5, 2006, and U.S. patent application Ser. No. 11/237,165, entitled "Address Generation Method For Combining Multiple Selection Results," filed concurrently, by Peter Chambers, which patent applications are incorporated herein by reference in their entireties.

FIELD OF THE INVENTION

The invention relates to the programming and control of integrated circuits and, in particular, to a power saving method in programming of an integrated circuit using externally applied analog voltages.

DESCRIPTION OF THE RELATED ART

Integrated circuits (ICs) often have user selectable operating modes and the selection of a particular operating mode is often made by tying individual control pins to ground or to the positive power supply voltage (Vdd or Vcc). Several control pins are often used in concert to create a digital control word to allow a few pins to control various programmable functions on the integrated circuit. Binary input control logic, while simple to implement, fails to meet the needs of increasingly complex ICs because external control pins increase with the number of operating conditions being controlled.

Electronics systems possessing some level of intelligence, such as microprocessors or microcontrollers, can circumvent the pin count limitation by inputting data via a serial data port or a shared data bus. But not all ICs have the ability to manipulate data in this manner, and adding microprocessing circuitry would be adding unwarranted complexity to the core product.

An example of a simple product with complex programming needs is a multiple output low-dropout linear voltage regulator (LDO). In general, LDOs are offered in a variety of fixed output voltages. For instance, a given LDO may offer ten output voltage options, such as 2.5, 2.7, 2.8, 3.0, 3.2, 3.3, 3.6, 3.8, 4.0, and 5.0 volts. A dual output LDO can be formed capable of offering two output voltages being any combination of the aforementioned set of ten output voltages. Such a dual LDO IC would have 100 different operating modes and would need a way to select the 100 possible combinations. A triple output LDO would push the different operating modes to 1,000 selections.

Binary input control logic remains the programming technique in wide use today where tying one or more control pins to a logical high (Vdd or Vss voltage) or to a logical low (ground) selects the various operating options the IC offers. When the binary input control programming technique is used, the number of control pins required is N where $2^N$ is greater than the number of programmable options required. For example, 2 options can be programmed using 1 pin, 3–4 options can be programmed using 2 pins, 5–8 options can be programmed using 3 pins, and 9–16 options can be programmed using 4 pins, and so on.

When binary input control programming is used in a dual output LDO with 100 different operating modes, seven control pins ($2^7=128$) will be required. For a triple output LDO with 1,000 possible output voltage combinations, ten control pins ($2^{10}=1024$) will be required. However, with the package size of integrated circuits being a key consideration for use in consumer products, high pin counts defeat the advantages brought by placing several regulators in a single package because the package size is dominated by the number of control pins needed instead of the size of the silicon encapsulated inside.

Under the binary input control logic, each pin represents two digital states, each digital state associated with an operating mode. Programming techniques using a single control pin to represent more than two digital states are also known. Typically, a set of voltage levels between the positive power supply and ground are designed to represent a set of digital states which can be selected by a voltage applied to the control pin. In general, a resistive divider between the positive power supply voltage and ground is used to apply the desired voltage to the control pin and an analog-to-digital converter converts the input voltage to select one of multiple operating modes assigned to the pin.

When each input pin can represent more than a pair of digital stages, the total number of control pins required to program a given number of digital states can be significantly reduced. The table below illustrates the number of digital states that can be programmed on two, three or four control pins when each pin can represent two to ten digital states. As shown in the table below, three control pins each having 10 digital states capability can be used to select one of 1,000 possible operating modes. This represents a large pin count reduction as compared to the binary input control technique where 10 pins would be required to program 1,000 possible operating modes.

| Digital States | Programming Pins | | |
| --- | --- | --- | --- |
| | 2 | 3 | 4 |
| 2 | 4 | 8 | 16 |
| 3 | 9 | 27 | 81 |
| 4 | 16 | 64 | 256 |
| 5 | 25 | 125 | 625 |
| 6 | 36 | 216 | 1,296 |
| 7 | 49 | 343 | 2,401 |
| 8 | 64 | 512 | 4,096 |
| 9 | 81 | 729 | 6,561 |
| 10 | 100 | 1,000 | 10,000 |

The conventional technique for programming multiple digital states (or addresses) on a signal pin requires the use of high precision resistors (such as 1% tolerance resistors) in order to generate precise input voltage values. In general, a method for programming an integrated circuit that minimizes the number of package pins, power consumption and silicon area for a given number of digital codes is desired. Furthermore, reliable programming operation given a large resistor tolerance and variations in power supply conditions and temperature conditions is desired.

SUMMARY OF THE INVENTION

According to one embodiment of the present invention, a circuit in an integrated circuit having an input terminal to be coupled to a resistor network for selecting one of multiple digital states in the integrated circuit includes a voltage decode circuit, a control circuit and a power-up control circuit. The first input terminal receives an input voltage having a first voltage value being one of multiple predetermined programming voltage values. The programming voltage values are associated with the multiple digital states. The voltage decode circuit receives the input voltage and generates a signal indicative of the voltage value of the input voltage. The control circuit receives the signal from the voltage decode circuit and generates an output control signal based on the signal from the voltage decode circuit where the output control signal selects one of the multiple digital states. The power-up control circuit provides power to the resistor network, the voltage decode circuit and the control circuit for determining the selected digital state and disconnects power to the resistor network, the voltage decode circuit and the control circuit after the selected digital state is determined.

According to another aspect of the present invention, a method in an integrated circuit having an input terminal to be coupled to a resistor network for selecting one of multiple digital states in the integrated circuit includes receiving an input voltage on the input terminal where the input voltage has a first voltage value being one of multiple predetermined programming voltage values, each predetermined programming voltage value being associated with one of the multiple digital states, decoding the input voltage to obtain a voltage decode signal indicative of the voltage value of the input voltage, generating an output control signal based on the voltage decode signal where the output control signal selects one of the multiple digital states, and disconnecting power to circuitry for receiving the input voltage, decoding the input voltage, and generating the output control signal when the value of the output control signal is determined.

The present invention is better understood upon consideration of the detailed description below and the accompanying drawings.

DETAILED DESCRIPTION OF THE PREFERRED EMBODIMENTS

In accordance with the principles of the present invention, an apparatus and a method for programming and control of an integrated circuit includes a control pin receiving an applied input control voltage selected from a set of predetermined programming voltages and an on-chip control voltage decode circuit to select one of multiple programming states for the integrated circuit based on the applied input control voltage. In one embodiment, an off-chip voltage divider is used to establish the set of predetermined programming voltages. The on-chip control voltage decode circuit includes a voltage divider to generate comparison voltage levels for detecting the voltage level of the input control voltage for selecting the desired programming state. In this manner, programming and control of the integrated circuit does not rely on absolute resistance values but rather the ratio of resistance values to establish the programming voltages and the comparison voltages. High accuracy in programming can be achieved even when low tolerance resistors are used to form the voltage dividers.

In one embodiment, the off-chip voltage divider establishes a set of N predetermined programming voltages between and including the positive power supply voltage $V_{SUPPLY}$ and the negative power supply $V_{SS}$. The N predetermined programming voltages are evenly distributed between and including the positive power supply voltage $V_{SUPPLY}$ and the negative power supply $V_{SS}$. The on-chip control voltage decode circuit includes a voltage divider to generate N−1 comparison voltage levels where the N−1 comparison voltage levels are voltage midpoints of each pair of adjacent programming voltages. In this manner, the selected input control voltage can be accurately detected even when low tolerance resistors are used to form the off-chip and on-chip voltage dividers as the accuracy of the voltage decoding operation is determined by the ratio of the resistance values and not the absolute resistance values.

In the present description, the term "positive power supply voltage" refers to a power supply voltage greater than the ground voltage. Typically, the positive power supply voltage in an integrated circuit is referred to as the $V_{SUPPLY}$, Vdd or Vcc voltage. Furthermore, in the present description, the term "negative power supply voltage" refers to the ground voltage or a power supply voltage less than the ground voltage. Typically, the negative power supply voltage in an integrated circuit is referred to as the ground (GND) or $V_{SS}$ voltage.

Figure 1:
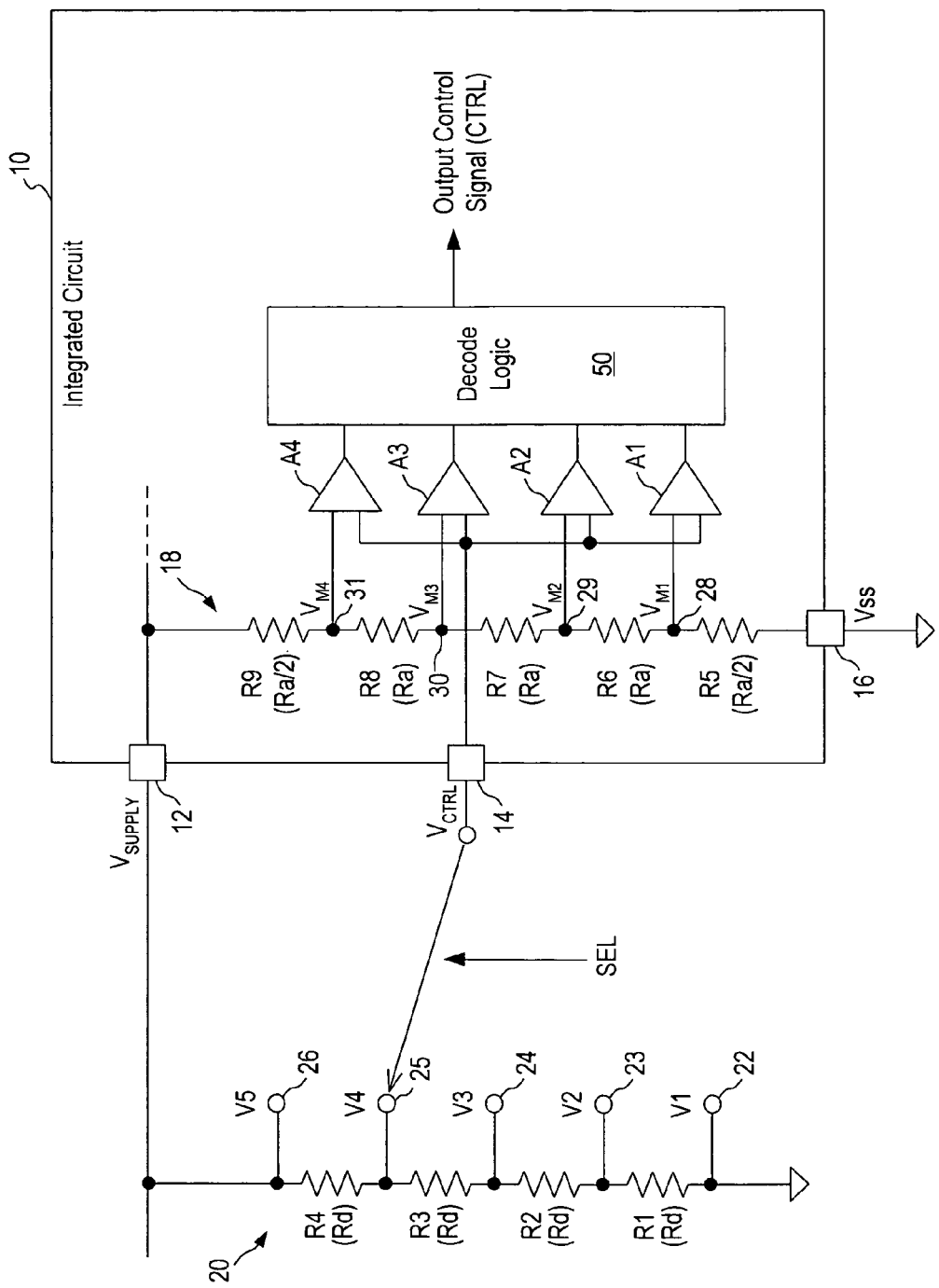
FIG. 1 is a schematic diagram of an integrated circuit incorporating a control voltage decode circuit and coupled to receive an applied input control voltage according to a first embodiment of the present invention.

FIG. 1 is a schematic diagram of an integrated circuit incorporating a control voltage decode circuit and coupled to receive an applied input control voltage according to a first embodiment of the present invention. Referring to FIG. 1, an integrated circuit 10 includes a first power supply terminal 12 for receiving a positive power supply voltage $V_{SUPPLY}$ and a second power supply terminal 16 for receiving a negative power supply voltage $V_{SS}$. Integrated circuit 10 has multiple user selectable operating modes. Each operating mode is associated with a digital state and an output control signal CTRL is used to address or select one of the multiple digital states of integrated circuit 10. In most cases, output control signal CTRL is an n-bit address signal where the number of possible programmable digital states is $2^n$.

In integrated circuit 10, the desired digital state is selected by coupling a control pin 14 to a desired programming voltage. Control pin 14 is assigned to more than two digital states so that the control pin can be operated to represent multiple operating modes of the integrated circuit. For instance, in the present embodiment, control pin 14 receives an input control voltage $V_{CTRL}$ selected from a set of predetermined programming voltages V1 to V5. Accordingly, control pin 14 is assigned to five digital states associated with the five programming voltages V1 to V5.

In the present embodiment, a voltage divider 20 is used to generate the predetermined programming voltages V1 to V5. In accordance with the present invention, voltage divider 20 includes two or more resistors with equal resistance values to divide up the voltage difference between the positive and negative power supply voltages (i.e. $V_{SUPPLY}$–$V_{SS}$) into evenly distributed voltage levels. The set of programming voltages thus form includes the power supply voltages $V_{SUPPLY}$ and $V_{SS}$ and voltages that are evenly distributed between the power supply voltages. In the embodiment shown in FIG. 1, voltage divider includes four resistors R1 to R4 having equal resistance values Rd connected in series between the positive power supply voltage $V_{SUPPLY}$ and the negative power supply voltage $V_{SS}$. A set of five voltages between and including the power supply voltages is thus generated to be used as the programming voltages. For instance, voltage V1 is the $V_{SS}$ voltage, voltage V2 is generated at a node 23 between resistors R1 and R2, voltage V3 is generated at a node 24 between resistors R2 and R3, voltage V4 is generated at a node 25 between resistors R3 and R4, and voltage V5 is the $V_{SUPPLY}$ voltage.

By using voltage levels that are evenly distributed between the power supply voltages as the programming voltages, detection of the selected programming voltage is made easy by using comparison voltage levels that are the voltage midpoints of each pair of adjacent programming voltages. Thus, resistors R1 to R4 do not have to be high tolerance resistors as the programming voltages are not required to have precise voltage levels.

In accordance with the present invention, control pin 14 is switchably connected to a desired programming voltage selected from voltages V1 to V5. In the present embodiment, a select signal SEL, which can be a user programmable select signal, is used to control the selection of the desired programming voltage. In this manner, the programming state of integrated circuit 10 can be changed over the course of the device operation by asserting select signal SEL to select a different programming voltage. The switchable means for switchably connecting control pin 14 to a desired programming voltage can be implemented using any switching or selection device, currently known or to be developed. The exact configuration of the switchable means is not critical to the practice of the present invention.

To determine the user-selected operating mode, integrated circuit 10 includes an on-chip control voltage decode circuit coupled to control pin 14 to decode the input control voltage coupled thereto and to generate the output control signal to select the corresponding digital state. The control voltage decode circuit in integrated circuit 10 includes the circuitry shown in FIG. 1 between the control pin 14 and the output control signal CTRL. The remaining circuitry in integrated circuit 10 receiving the output control signal CTRL is not shown in FIG. 1.

In integrated circuit 10, the input control voltage $V_{CTRL}$ on control pin 14 is coupled to an analog-to-digital converter (ADC) to decode the selected programming voltage. In the present embodiment, the ADC of the control voltage decode circuit includes a voltage divider 18 and a bank of comparators A1 to A4. Each comparator receives the input control voltage $V_{CTRL}$ on a first input terminal and a comparison voltage on a second input terminal generated by the voltage divider 18. Voltage divider 18 is formed by five resistors R5 to R9 connected in series between the power supply voltage $V_{SUPPLY}$ and the ground voltage $V_{SS}$. Voltage divider 18 generates four comparison voltage levels $V_{M1}$ to $V_{M4}$ to be used by comparators A1 to A4.

The resistance values for resistor R5 to R9 are selected so that the comparison voltage levels $V_{M1}$ to $V_{M4}$ have voltage values that are the voltage midpoints between each pair of adjacent programming voltages V1 to V5. Thus, resistors R6, R7 and R8 have the same resistance value Ra while resistors R5 and R9 have the same resistance value that is half of resistance Ra, that is, resistance Ra/2. Resistance Ra does not have to be equal to resistance Rd of resistors R1 to R4 because the control voltage decode circuit operates on voltage ratios, not absolute voltage values. Thus, as long as resistors R1 to R4 have the same resistance value Rd and resistors R6 to R8 have the same resistance value Ra and resistors R5 and R9 have the same resistance value Ra/2, the programming voltages will be proportional to the comparison voltage levels to allow effective comparison of the programming voltages.

As thus generated, voltage $V_{M1}$ is a voltage midpoint between voltage V1 and voltage V2, voltage $V_{M2}$ is a voltage midpoint between voltage V2 and voltage V3, voltage $V_{M3}$ is a voltage midpoint between voltage V3 and voltage V4, and voltage $V_{M4}$ is a voltage midpoint between voltage V4 and voltage V5. By using the four voltage midpoints $V_{M1}$ to $V_{M4}$ as the comparison voltage levels, the control voltage decode circuit can differentiate between the five programming voltages V1 to V5.

Comparators A1 to A4, each receiving the input control voltage $V_{CTRL}$ and a respective one of the comparison voltage levels, monitor and measure the input control voltage $V_{CTRL}$ received on control pin 14. Comparators A1 to A4 provide comparison results which are coupled to a decode logic circuit block 50. Decode logic circuit block 50 combines the comparison results to generate the output control signal CTRL. For instance, a look-up table can be used to convert the four comparison results to specific values for the output control signal CTRL.

The integrated circuit (IC) programming circuit and method of the present invention have wide applications and provides many advantages over the conventional IC programming circuits and methods.

First, the IC programming circuit and method of the present invention allows multiple states to be programmed on a single control pin while allowing the use of low tolerance or low precision external resistors. The IC programming circuit of the present invention can thus be practiced with reduced cost while maintaining high level of reliability. The programming operation is highly reliable because the voltage selection is based on resistance ratio but not absolute resistance values. Thus, the analog-to-digital conversion of the input control voltage can be accurate even if the absolute resistance values of the external resistors are not precise.

Second, the programming voltages as well as the comparison voltage levels are proportional to the difference between the power supply voltages $V_{SUPPLY}$ and $V_{SS}$ so that the programming voltages track variations in the power supply voltages in the same manner as the comparison voltage levels. The programming control of the integrated circuit can thus be made accurate over variations in the power supply voltages.

Third, the control pin of the integrated circuit can be selectively connected to different programming voltage levels to allow different functions to be programmed on the same pin. Specifically, the select signal SEL can be toggled to connect control pin 14 to different programming voltage with each programming voltage being indicative of a different operation mode for the integrated circuit. For example, the IC programming circuit and method of the present invention can be applied in a key fob device where a key on the key fob is pressed to change the value of the select signal SEL. Thus, pressing a particular key on the key fob will cause a different programming voltage to be selected on the control pin. The control voltage decode will decode the selected programming voltage to determine the operation mode currently being selected by the user of the key fob. In this manner, different functions or operation modes can be controlled through a single control pin.

Figure 2:
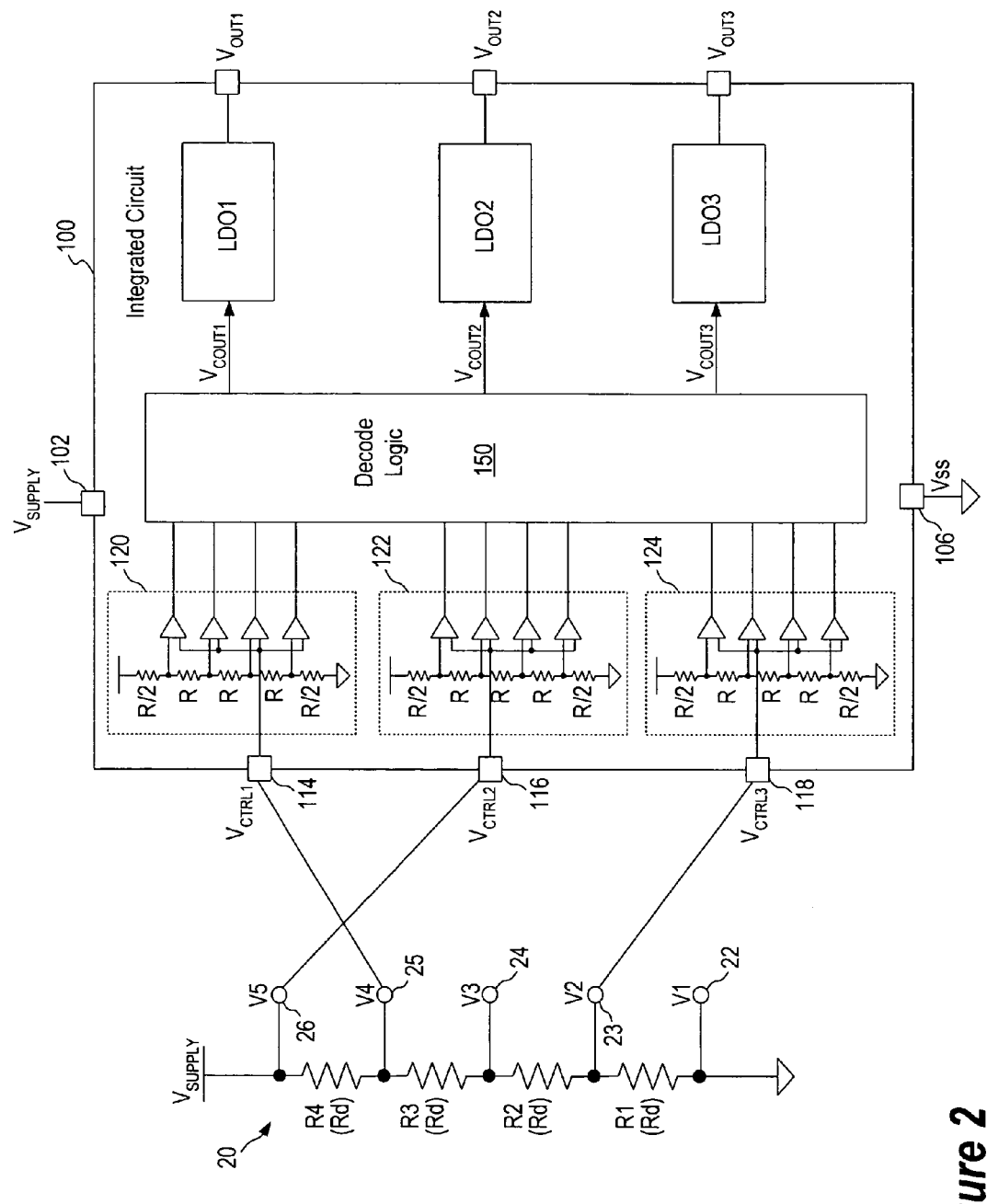
FIG. 2 is a schematic diagram of an integrated circuit incorporating a set of control voltage decode circuits and coupled to receive a set of applied input control voltages according to a second embodiment of the present invention.

In the embodiment shown in FIG. 1, the integrated circuit programming circuit and method of the present invention are applied to provide programming of a single control pin. The integrated circuit programming circuit and method can be advantageously applied to the programming of multiple control pins where only a single external voltage divider is required for providing control voltages for all of the control pins to be programmed. FIG. 2 is a schematic diagram of an integrated circuit incorporating multiple control pins coupled to receive a set of applied input control voltages according to a second embodiment of the present invention. Referring to FIG. 2, integrated circuit 100 is illustrated as a triple LDO device including three LDO (low-voltage drop-out) circuits (LDO1, LDO2 and LDO3) providing three separate output voltages $V_{OUT1}$, $V_{OUT2}$, and $V_{OUT3}$. Each LDO circuit is individually programmed via a control voltage signal ($V_{OUT1}$, $V_{OUT2}$ or $V_{OUT3}$) provided to each LDO circuit to select a desired output voltage for that LDO circuit.

Integrated circuit 100 includes three controls pins 114, 116 and 118 each receiving one of five possible programming voltages. Control pins 114, 116 and 118 are coupled to an on-chip control voltage decode circuit to generate the three control voltage signals $V_{COUT1}$, $V_{COUT2}$ or $V_{COUT3}$ for LDO circuits LDO1, LDO2 and LDO3. When each control pin is capable of five different programming levels, the three control pins together provides 125 output voltage combinations for the three LDO devices.

To program the three control pins 114, 116 and 118, a single voltage divider 20 is used. In the present embodiment, voltage divider 20 is constructed in the same manner as the voltage divider in FIG. 1 and includes resistors R1 to R4 of equal resistance values. Voltage divider 20 provides five programming voltages V1 to V5 which can be switchably connected to one or more of control pins 114, 116 and 118.

Integrated circuit 100 includes a first power supply terminal 102 for receiving a positive power supply voltage $V_{SUPPLY}$ and a second power supply terminal 106 for receiving a negative power supply voltage $V_{SS}$. Voltage divider 20 is connected between the power supply voltages $V_{SUPPLY}$ and $V_{SS}$ of integrated circuit 100 so that variations in the power supply voltages $V_{SUPPLY}$ and $V_{SS}$ will affect voltage divider 20 in the same manner as the circuitry inside integrated circuit 100.

The programming voltages coupled to control pins 114, 116 and 118 are decoded by an on-chip control voltage decode circuit to generate the control voltage signals. To accommodate the three control pins, three sets of analog-to-digital converters (ADC) 120, 122 and 124 are included, each ADC being coupled to a respective control pin. Each ADC (120, 122 or 124) includes a set of comparators coupled to receive a respective input control voltage ($V_{CTRL1}$, $V_{CTRL2}$, and $V_{CTRL3}$) and a set of comparison voltage levels. Each ADC decodes the respective input control voltage and provides the comparison results to a decode logic circuit 150. Decode logic circuit block 150 combines the comparison results of the three ADC circuits 120, 122 and 124 to generate the output control signals $V_{COUT1}$, $V_{COUT2}$ and $V_{COUT3}$ for driving the LDO circuits. For instance, a look-up table can be used to convert the twelve comparison results to specific values for the output control signals.

When the IC programming circuit and method of the present invention is applied to program multiple control pins, only a single external voltage divider is required to allow multiple control pins to be programmed. Furthermore, the programming of each control pin can be individually altered by switchably connecting a control pin to a desired programming voltage, such as through a user selectable control. The IC programming circuit and method of the present invention can be implemented with reduced cost while providing increased flexibility.

FIG. 2 illustrates one application of the IC programming circuit and method of the present invention as applied to program multiple LDO circuits. The application shown in FIG. 2 is illustrative only. It is understood that the IC programming circuit and method of the present invention can be applied to any applications where programming the operation state of an integrated circuit using an externally applied control voltage is desired.

According to another aspect of the present invention, the integrated circuit programming circuit and method implement a power saving mode whereby the external voltage divider and the on-chip control voltage decode circuit are powered down once the programming voltage is decoded and the desired programming state is latched. In this manner, the programmed voltage is read upon power up of the integrated circuit and then external voltage divider and internal decoding circuit are shut down to conserve power. Power consumption by the integrated circuit can be greatly reduced when the external voltage divider and the on-chip voltage divider the decode circuit no longer draw current. The power saving mode provides particularly advantage when the integrated circuit is applied in battery powered applications where power conservation is important.

Figure 3:
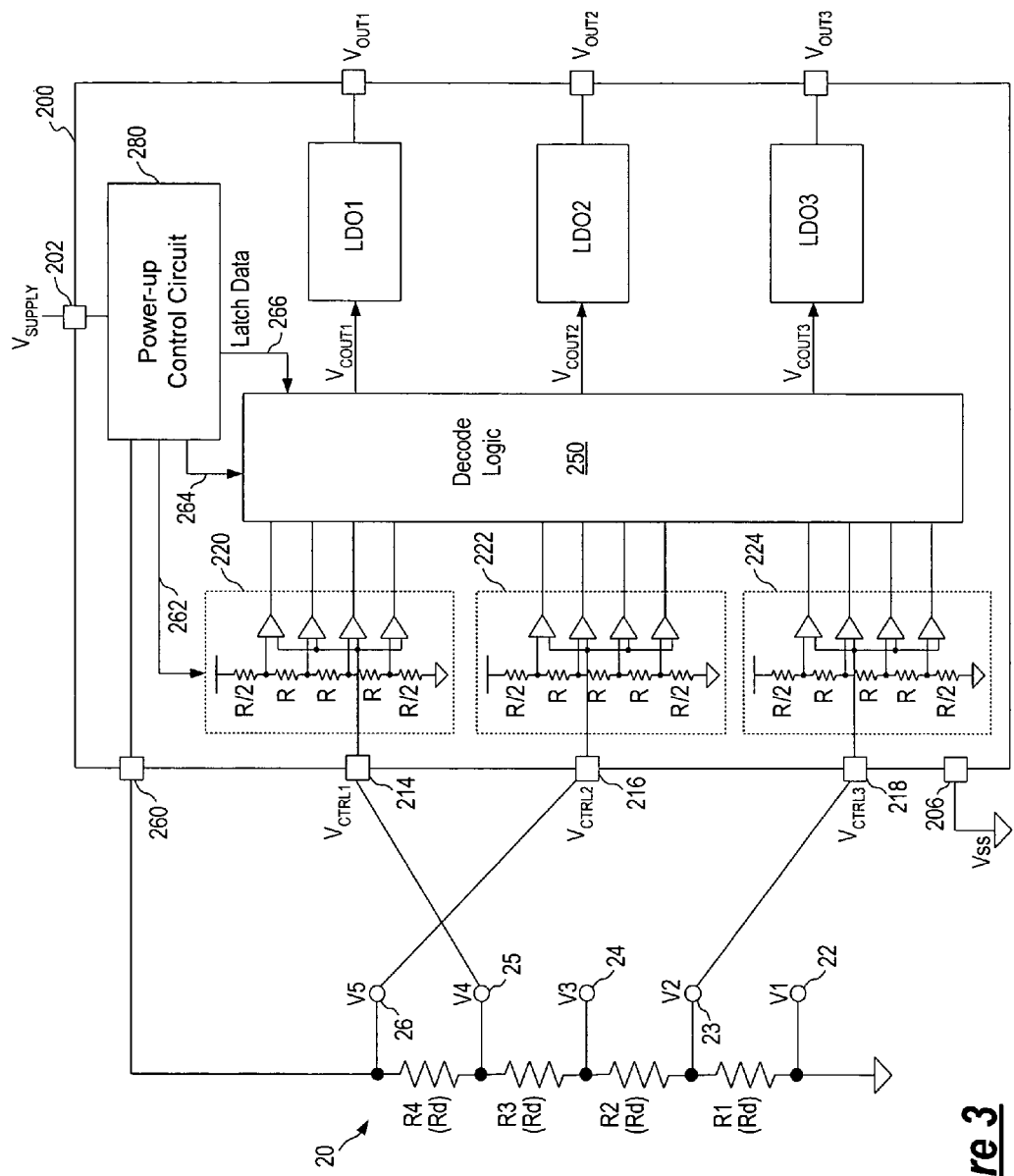
FIG. 3 is a schematic diagram of an integrated circuit incorporating a control voltage decode circuit with a power-down circuit according to a third embodiment of the present invention.

FIG. 3 is a schematic diagram of an integrated circuit incorporating a control voltage decode circuit with a power-down circuit according to a third embodiment of the present invention. Referring to FIG. 3, integrated circuit 200 is constructed in a similar manner as integrated circuit 100 of FIG. 2 except for an on-chip power-up control circuit 280. Specifically, power-up control circuit 280 is connected to the positive power supply voltage terminal 202 receiving the power supply voltage $V_{SUPPLY}$. Power-up control circuit 280 determines when power is to be provided to the external voltage divider 20 (through terminal 260), when power is provided to the ADC circuits 220, 222 and 224 (through power bus 262), and when power is to be provided to the decode logic circuit 250 (through power bus 264). Power-up control circuit 280 also provides a Latch Data signal on a bus 266 to the decode logic circuit 250 to instruct the decode logic circuit 250 to latch and store the currently decoded data.

In operation, power-up control circuit 280 provides power to the external voltage divider 20 and all internal circuitry of integrated circuit 200 upon power up. The on-chip control voltage decode circuit operates to take a snapshot of the programming voltage coupled to control pins 214, 216 and 218 and decode the programming voltage to provide the output control signals $V_{COUT1}$, $V_{COUT2}$ or $V_{COUT3}$. Thereafter, power-up control circuit 280 instructs the decode logic circuit 250 to latch the output control signals. Once the desired programming conditions are latched, power-up control circuit 280 will then disconnect the power supply voltage $V_{SUPPLY}$ provided to external voltage divider 20 and the on-chip control voltage decode circuit. In this manner, integrated circuit 200 obtains the desired programming conditions but the programming and decode circuitry no longer consumer power.

Power-up control circuit 280 can be implemented using switches for connecting and disconnecting the power supply terminal 202 to the power buses of the respective circuitry (the external voltage divider 20 and the on-chip control voltage decode circuit). Other methods for connecting and disconnecting power to the power buses can also be used.

In the present description, the power saving method is shown as being applied to the integrated circuit programming circuit and method of the present invention. One of ordinary skill in the art would appreciate that the power saving method of the present invention is applicable to all types of IC programming circuit and method. Basically, the power saving method operates by reading the programmed voltage of an integrated circuit upon power-up and then once the desired programming state is determined and the data associated with the selected programming state is latched, the power saving method powers down all circuitry relating to the programming operation. The power down operation can include any external circuitry, such as resistive dividers, used to provide the programming voltage. In this manner, power consumption in the integrated circuit is greatly reduced as unnecessary circuitry are powered down and no longer drawing current. The power saving method can be operated to power up the circuitry relating to the programming operation periodically or upon command to determine if the desired programming state has changed.

The power saving mode in the integrated circuit programming and control circuit and method of the present invention is particularly useful in battery powered applications where all non-essential circuitry must be powered down to conserve battery power. By applying the power saving mode in the programming operation in accordance with the present invention, the integrated circuit can interrogate the programming voltages upon power up and then enter a low-power quiescent mode once the programming conditions are determined.

In the above-described embodiments, the off-chip (or external) voltage divider used to generate the multiple programming voltages is implemented as a resistive divider. However, in other embodiments, other types of voltage dividers can be used in place of the resistive divider. Furthermore, other circuit configuration for generating a set of programming voltages can also be used.

Figure 4:
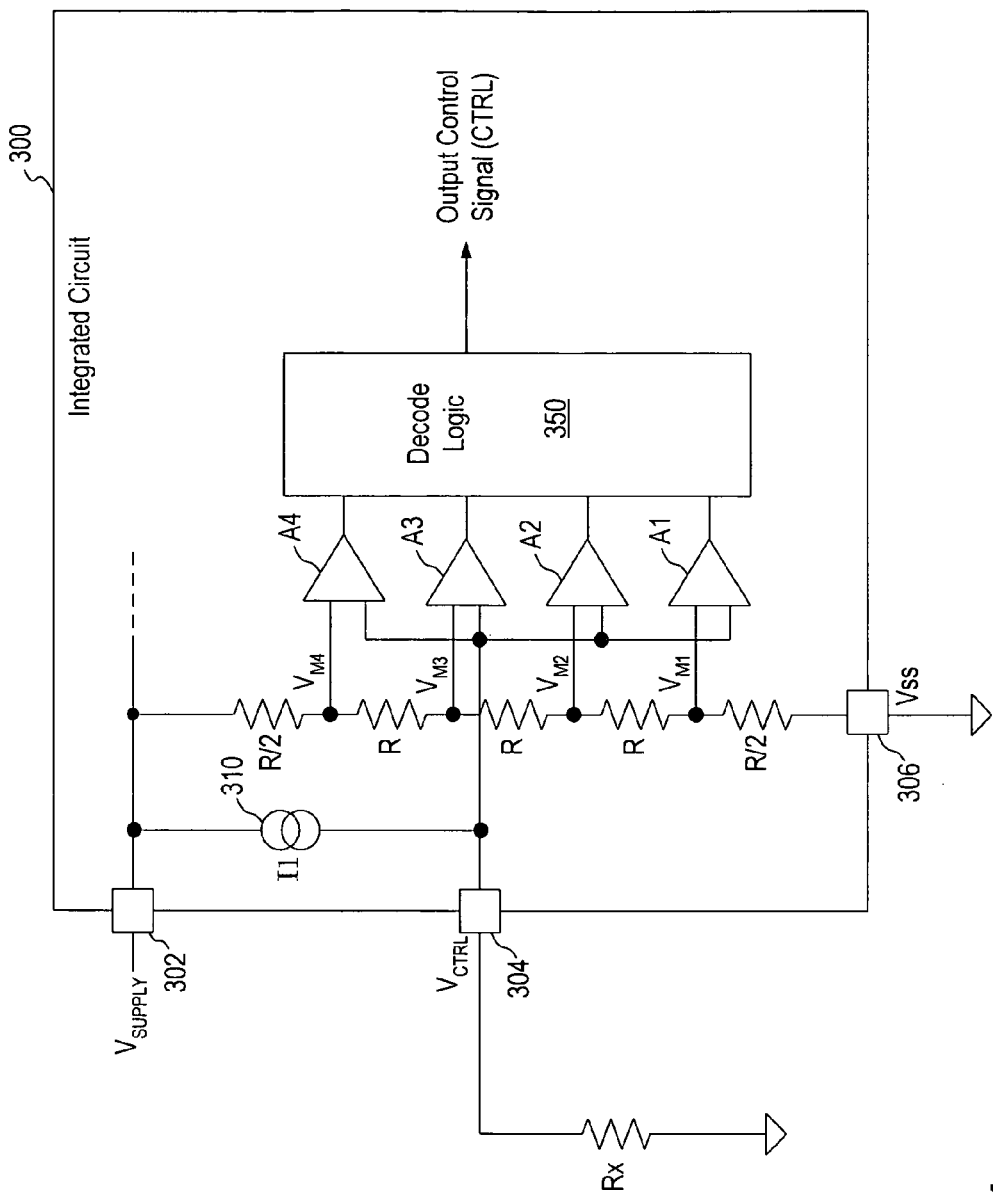
FIG. 4 is a schematic diagram of an integrated circuit incorporating a control voltage decode circuit and coupled to receive an applied input control voltage according to a fourth embodiment of the present invention.

According to another aspect of the present invention, the programming voltage applied to a control pin is generated by flowing a constant current through a precision resistor. The constant current can be provided to multiple control pins where each control pin can be coupled to different resistance values to generate the desired programming voltage. FIG. 4 is a schematic diagram of an integrated circuit incorporating a control voltage decode circuit and coupled to receive an applied input control voltage according to a fourth embodiment of the present invention.

Referring to FIG. 4, an integrated circuit 300 includes a first power supply terminal 302 receiving a positive power supply voltage $V_{SUPPLY}$ and a second power supply terminal 306 receiving a negative power supply voltage $V_{SS}$. Integrated circuit 300 includes a constant current source 310 providing a current I1 to a control pin 304. To program a desired control voltage $V_{CTRL}$ on control pin 304, a resistor Rx having a predetermined resistance value is connected to control pin 304. As a result of current I1 flowing through resistor Rx, a voltage having the desired voltage level develops at control pin 304 as the input control voltage $V_{CTRL}$. The input control voltage $V_{CTRL}$ is coupled to the on-chip control voltage decode circuit to be decoded into an output control signal CTRL in the same manner as described above with reference to FIG. 1.

The resistance value for resistor Rx is selected from a predetermined set of resistance values where each resistance value provides a desired programming voltage. The resistance values are selected so that the programming voltages are evenly distributed between the power supply voltages $V_{SUPPLY}$ and $V_{SS}$ and may include the power supply voltages. In this manner, the on-chip control voltage decode circuit can readily decode the programming voltage by comparing the input control voltage $V_{CTRL}$ to voltage midpoints $V_{M1}$ to $V_{M4}$ which are the voltage midpoints of each pair of adjacent programming voltages.

When the IC programming method of FIG. 4 is used, a single external resistor is used to set the programming voltage for a single control pin. When the integrated circuit includes multiple control pins, each control pin is supplied with its own constant current and is coupled to its own resistor to set the desired programming voltage for that pin. That is, each control pin is coupled to its own individual current source supplying a constant current to the control pin. In this manner, an integrated circuit with multiple control pins can be programmed by coupling individual resistors to each control pin where the individual resistors have resistance values selected from a set of predetermined resistance values. The resistance value of each resistor can be trimmed to obtain the desired precise resistance value.

In the above-described embodiments, the programming voltages include the power supply voltages $V_{SUPPLY}$ and $V_{SS}$ and voltages evenly distributed between the power supply voltages. However, in other embodiments, the set of programming voltage may or may not include one or both of the power supply voltages. It is only important that the programming voltages are evenly distributed to allow ready decoding of the programming voltages using the voltage midpoints of programming voltages.

Furthermore, in the above-described embodiments, the integrated circuit programming circuit and method of the present invention is described as operating with five programming voltages. This is illustrative only and the integrated circuit programming circuit and method of the present invention can in fact be operated with any number of programming voltages.

For example, in one embodiment, an integrated circuit has up to 120 operation modes. If a binary programming system is used, up to seven control pins are required to program the 120 operation modes. In applications where small IC footprint and low pin count is critical, using seven control pins may not be feasible. However, in accordance with the present invention, 12 programming voltages between and/or including the power supply voltages may be used so that each control pin can be programmed to 12 different digital states. Therefore, two control pins can provide 144 programmable states, sufficient to program the 120 operation modes required by the integrated circuit. Thus, by using the IC programming method of the present invention, a small number of pins can be used to program a large number of operation modes to reduce the pin count, the device footprint and ultimately the power consumption of the integrated circuit.

The above detailed descriptions are provided to illustrate specific embodiments of the present invention and are not intended to be limiting. Numerous modifications and variations within the scope of the present invention are possible. The present invention is defined by the appended claims.

We claim:

1. A circuit in an integrated circuit having an input terminal to be coupled to a resistor network for selecting one of a plurality of digital states in the integrated circuit, the circuit comprising:
the first input terminal receiving an input voltage having a first voltage value being one of a plurality of predetermined programming voltage values, each predetermined programming voltage value being associated with one of the plurality of digital states;
a voltage decode circuit for receiving the input voltage and generating a signal indicative of the voltage value of the input voltage;
a control circuit receiving the signal from the voltage decode circuit and generating an output control signal based on the signal from the voltage decode circuit, the output control signal selecting one of the plurality of digital states; and
a power-up control circuit for providing power to the resistor network, the voltage decode circuit and the control circuit for determining the selected digital state and for disconnecting power to the resistor network, the voltage decode circuit and the control circuit after the selected digital state is determined.

2. The circuit of claim 1, wherein the power-up control circuit instructs the control circuit to latch the value of the output control signal prior to disconnecting power to the resistor network, the voltage decode circuit and the control circuit.

3. The circuit of claim 1, wherein after disconnecting power to the resistor network, the voltage decode circuit and the control circuit, the power-up control circuit provides power to the resistor network, the voltage decode circuit and the control circuit periodically to determine the currently selected digital state based on the current value of the input voltage.

4. A method in an integrated circuit having an input terminal to be coupled to a resistor network for selecting one of a plurality of digital states in the integrated circuit, the method comprising:
receiving an input voltage on the input terminal, the input voltage having a first voltage value being one of a plurality of predetermined programming voltage values, each predetermined programming voltage value being associated with one of the plurality of digital states;
decoding the input voltage to obtain a voltage decode signal indicative of the voltage value of the input voltage;
generating an output control signal based on the voltage decode signal, the output control signal selecting one of the plurality of digital states; and
disconnecting power to circuitry for receiving the input voltage, decoding the input voltage, and generating the output control signal when the value of the output control signal is determined.

5. The method of claim 4, further comprising latching the value of the output control signal prior to disconnecting power to circuitry for receiving the input voltage, decoding the input voltage, and generating the output control signal.

6. The method of claim 4, further comprising powering up the circuitry for receiving the input voltage, decoding the input voltage, and generating the output control signal periodically to based on the current value of the input voltage.

* * * * *